(12) United States Patent  
Lee et al.

(10) Patent No.: US 8,704,561 B2  
(45) Date of Patent: Apr. 22, 2014

(54) DELAY LOCKED LOOP

(75) Inventors: Hye-Young Lee, Gyeonggi-do (KR); Yong-Mi Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/285,088

(22) Filed: Oct. 31, 2011

(65) Prior Publication Data

US 2013/0038363 A1 Feb. 14, 2013

(30) Foreign Application Priority Data

Aug. 10, 2011 (KR) .................. 10-2011-0079534

(51) Int. Cl.  
*H03L 7/06* (2006.01)

(52) U.S. Cl.  
USPC ........... 327/149; 327/147; 327/153; 327/155; 327/158

(58) Field of Classification Search  
USPC .............. 327/141, 144–163; 331/1 A, 15–17; 375/373–376  
See application file for complete search history.

(56) References Cited

U.S. PATENT DOCUMENTS

| 6,069,506 | A  | * | 5/2000  | Miller et al. | 327/156 |
| 6,229,363 | B1 | * | 5/2001  | Eto et al.    | 327/158 |
| 6,944,833 | B2 | * | 9/2005  | Jeon          | 327/158 |
| 2004/0054977 | A1 | * | 3/2004 | Jeon | 716/10 |
| 2004/0239388 | A1 | * | 12/2004 | Lee | 327/158 |
| 2005/0242855 | A1 | * | 11/2005 | Lee | 327/158 |
| 2006/0261869 | A1 | * | 11/2006 | Gomm et al. | 327/158 |
| 2007/0085581 | A1 | * | 4/2007 | Ku | 327/158 |
| 2008/0030249 | A1 | * | 2/2008 | Zimlich | 327/161 |
| 2008/0191773 | A1 | * | 8/2008 | Oh | 327/276 |
| 2009/0027094 | A1 | * | 1/2009 | Gomm et al. | 327/158 |

FOREIGN PATENT DOCUMENTS

| KR | 100733465 | 6/2007 |
| KR | 100753101 | 8/2007 |
| KR | 100753137 | 8/2007 |
| KR | 100930416 | 12/2009 |
| KR | 101022674 | 3/2011 |

\* cited by examiner

*Primary Examiner* — Lincoln Donovan  
*Assistant Examiner* — Brandon S Cole  
(74) *Attorney, Agent, or Firm* — IP & T Group LLP

(57) ABSTRACT

A delay locked loop includes a delay adjusting unit configured to delay a first clock signal in outputting a second clock signal phase-locked with the first clock signal and generate a delay control signal in response to the first clock signal and the second clock signal and a variable delay line configured to output a third clock signal by delaying the first clock signal in response to the delay control signal.

16 Claims, 3 Drawing Sheets

DELAY LOCKED LOOP

CROSS-REFERENCE TO RELATED APPLICATIONS

The present application claims priority of Korean Patent Application No. 10-2011-0079534, filed on Aug. 10, 2011, which is incorporated herein by reference in its entirety.

BACKGROUND

1. Field

Exemplary embodiments of the present invention relate to a delay locked loop (DLL) used in a semiconductor device, and more particularly, to a DLL of a closed-loop type.

2. Description of the Related Art

In general, an integrated circuit such as a double data rate synchronous DRAM (DDR SDRAM) includes a delay locked loop (DLL) for allowing an internal clock signal and an external clock signal to have the same phase by compensating a time delay in an internal circuit that occurs in using the external clock signal. Here, the delay locked loop receives the external clock signal and compensates for a delay through a clock path and a data path by applying a negative delay in advance, thereby allowing data outputted from the integrated circuit to be synchronized with the external clock signal.

FIG. 1 is a block diagram of a conventional DLL.

Referring to FIG. 1, the DLL 100 includes an input buffer unit 110, a variable delay line 120, an output driver 130, a replica delay unit 140, a phase comparing unit 150 and a delay control unit 160. The input buffer unit 110 buffers an external clock EXTCLK to output an internal clock INTCLK. The variable delay line 120 delays the internal clock INTCLK by a first delay amount to output a delay locked clock DLLCLK in response to a delay control signal DELY_CTRL. The output driver 130 outputs the delay locked clock DLLCLK to outside through a DQ pad (not shown). The replica delay unit 140 delays the delay locked clock DLLCLK by a second delay amount (D3) to output a feedback clock FBCLK. The phase comparing unit 150 compares a phase of the internal clock INTCLK with a phase of the feedback clock FBCLK. The delay control unit 160 generates the delay control signal DELY_CTRL in response to an output of the phase comparing unit 150.

Here, the second delay amount (D3) is a replica delay amount equal to an actual delay through a clock path. The second delay amount (D3) is defined as a sum of a delay amount (D1) through an input path and a delay amount (D2) through an output path of the DLL 100. The input path is a path from a pad (not shown) where the external clock EXTCLK is inputted to a point where the internal clock INTCLK is generated. The output path is a path from a point where the delay locked clock DLLCKL is generated to the DQ pad.

Hereinafter, an operation of the DLL 100 will be explained in detail. It is assumed that a default/initial value of the first delay amount of the variable delay line 120 is set to "0".

At an initial operation, the input buffer unit 110 buffers the external clock EXTCLK to output the internal clock INTCLK to the variable delay line 120, and the variable delay line 120 passes the internal clock INTCLK without a delay since the first delay amount of the variable delay line 120 is set to "0" initially.

Subsequently, the replica delay unit 140 delays the delay locked clock DLLCLK by the second delay amount (D3) to output the feedback clock FBCLK to the phase comparing unit 150. Here, the second delay amount (D3) is a replica delay amount equal to an actual delay through the clock path and is set to a sum of the delay amount (D1) through the input path and the delay amount (D2) through the output path of the DLL 100. That is, the second delay amount (D3) is equal to a sum of the delay amount (D1) of the input buffer unit 110 and the delay amount (D2) of the output driver 130

The phase comparing unit 150 compares the phase of the internal clock INTCLK with the phase of the feedback clock FBCLK. The delay control unit 160 generates the delay control signal DELY_CTRL in response to the output of the phase comparing unit 150.

Accordingly, the variable delay line 120 delays the internal clock INTCLK by the controlled first delay amount to output the delay locked clock DLLCLK in response to the delay control signal DELY_CTRL.

The above-described operations are repeated during the operation of the DLL 100, where the first delay amount of the variable delay line 120 becomes locked when the phase of the internal clock INTCLK is synchronized with the phase of the feedback clock FBCLK.

FIG. 2 is a waveform diagram illustrating a locked state of the DLL 100 shown in FIG. 1.

Referring to FIG. 2, the phase of the internal clock INTCLK is synchronized with the phase of the feedback clock FBCLK at a point 'A'. At this time, the delay locked clock DLLCLK is lagging behind the internal clock INTCLK by the first delay amount (N*tCK−D3). Here, tCK is a unit cycle of the external clock EXTCLK.

Meanwhile, once the first delay amount (N*tCK−D3) of the variable delay line 120 is determined/locked, an operation for updating a delay amount of the variable delay line is performed at every desired period of time. Here, a jitter may occur in the delay locked clock DLLCLK due to noise and the update operation compensates this jitter.

However, during the update operation, a delay for reflecting an update result to the phase comparing unit 150 may occur according to a loop type of the conventional DLL 100. Here, a delay of the feedback clock FBCLK in reference to the internal clock INTCLK becomes a sum of the first delay amount (N*tCK−D3) of the variable delay line 120 and the second delay amount (D3) of the replica delay unit 140. Hereinafter, the delay of the feedback clock FBCLK in reference to the internal clock INTCLK is referred to as "a loop delay". The loop delay occurring in the update operation is a critical factor that determines a period of the update operation. If the loop delay is not considered when the period of the update operation is determined, a next update operation is performed before a previous update result is reflected in the delay locked clock DLLCLK. As a result, an overhitting feature that increases jitters may occur.

Thus, it is useful to have a DLL that minimizes/reduces a period of an update operation without the above-discussed overhitting feature. Here, the second delay amount (D3) of the replica delay unit 140, which is included in the loop delay, is a replica delay amount equal to an actual delay through a clock path. The second delay amount (D3) is affected by PVT (Process, Voltage, and Temperature) conditions so as to range from approximately 2 ns to approximately 4 ns. Here, there is a limit in minimizing a period of an update operation since the second delay amount (D3) of the replica delay unit 140 is determined by the PVT conditions.

SUMMARY

An exemplary embodiment of the present invention is directed to a delay locked loop (DLL) which is capable of minimizing/reducing a period of an update operation.

Another exemplary embodiment of the present invention is directed to a DLL which is capable of reducing current consumption while minimizing/reducing a period of an update operation.

In accordance with an exemplary embodiment of the present invention, a delay locked loop includes a delay adjusting unit configured to delay a first clock signal in outputting a second clock signal phase-locked with the first clock signal and generate a delay control signal in response to the first clock signal and the second clock signal and a variable delay line configured to output a third clock signal by delaying the first clock signal in response to the delay control signal.

In accordance with another exemplary embodiment of the present invention, a delay locked loop includes a replica delay unit configured to output a first delayed clock by delaying a source clock by a first delay substantially equal to a delay through a clock path, a delay control unit configured to generate a delay control signal in response to the source clock and the first delayed clock, and a first variable delay line configured to output a delay locked clock by delaying the source clock by a second delay for performing a locking operation of the delay locked loop in response to the delay control signal.

In accordance with yet another exemplary embodiment of the present invention, a delay locked loop includes a dividing unit configured to divide a source clock in outputting a divided clock, a replica delay unit configured to output a first delayed clock by delaying the divided clock by a first delay, a delay control unit configured to generate a delay control signal in response to the source clock and the first delayed clock, and a first variable delay line configured to output a delay locked clock by delaying the source clock by a second delay for performing a locking operation of the delay locked loop in response to the delay control signal.

DETAILED DESCRIPTION

Figure 1:
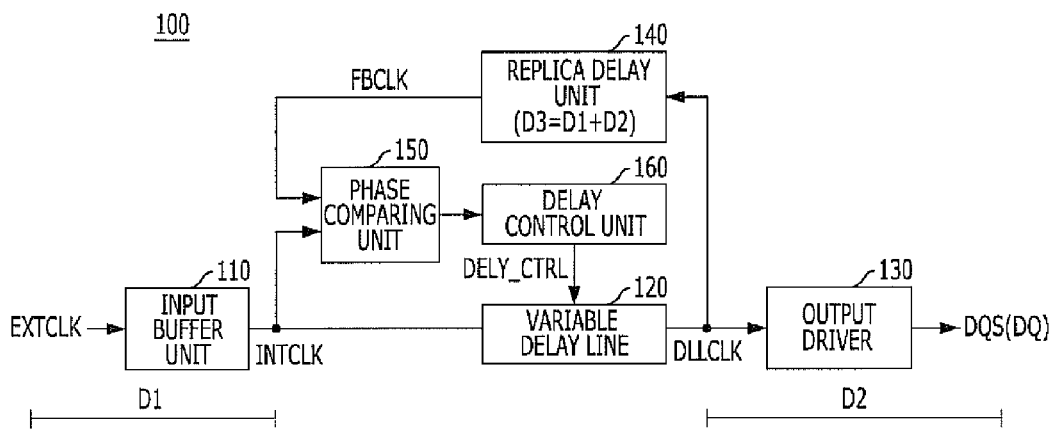
FIG. 1 is a block diagram of a conventional DLL.
Figure 2:
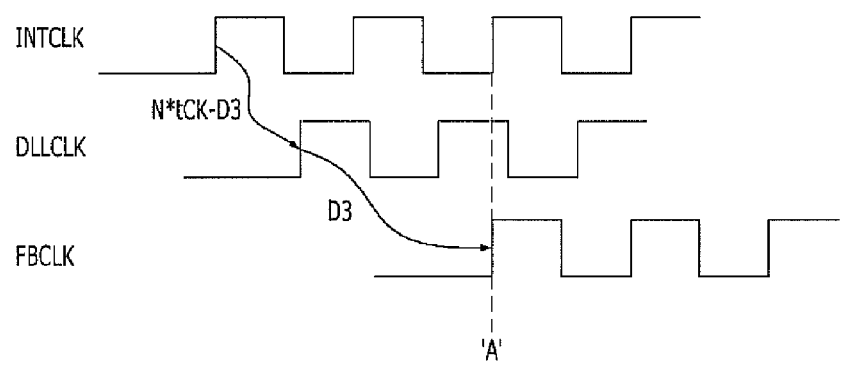
FIG. 2 is a waveform diagram illustrating a locking state of the DLL shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and exemplary embodiments of the present invention.

Figure 3:
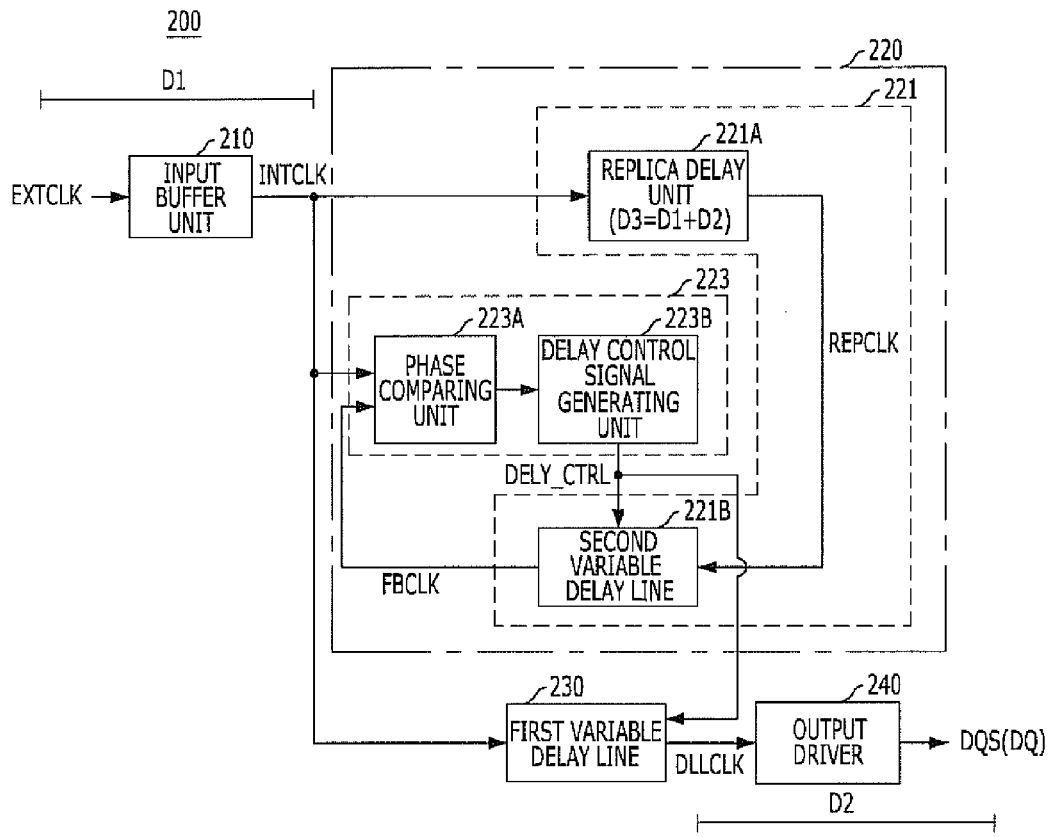
FIG. 3 is a block diagram of a DLL in accordance with an exemplary embodiment of the present invention.

FIG. 3 is a block diagram of a delay locked loop (DLL) 200 in accordance with an exemplary embodiment of the present invention.

Referring to FIG. 3, the DLL 200 includes an input buffer unit 210, a delay adjusting unit 220, a first variable delay line 230, and an output driver 240. The input buffer unit 210 is configured to buffer an external clock EXTCLK to output an internal clock INTCLK. The delay adjusting unit 220 is configured to delay the internal clock INTCLK to output a feedback clock FBCLK whose phase is substantially the same as the internal clock INTCLK and generate a delay control signal DELY_CTRL using the internal clock INTCLK and the feedback clock FBCLK. The first variable delay line 230 is configured to delay the internal clock INTCLK by a first delay amount to output a delay locked clock DLLCLK in response to the delay control signal DELY_CTRL. The output driver 240 is configured to output the delay locked clock DLLCLK to outside through a DQ pad (not shown).

Here, a delay amount of the delay adjusting unit 220 is a sum of the first delay amount for performing a locking operation of the DLL and a second delay amount (D3) which is a replica delay amount equal to an actual delay in a clock path. The second delay amount is defined as a sum of a delay amount (D1) through an input path and a delay amount (D2) through an output path of the DLL 200. The input path is a path from a pad (not shown) where the external clock EXTCLK is inputted to a point where the internal clock INTCLK is generated. The output path is a path from a point where the delay locked clock DLLCKL is generated to the DQ pad.

The delay adjusting unit 220 includes a delay unit 221 and a delay control unit 223. The delay unit 221 is configured to output the feedback clock FBCLK by delaying the internal clock INTCLK in response to the delay control signal DELY_CTRL. The delay control unit 223 is configured to generate the delay control signal DELY_CTRL based on the internal clock INTCLK and the feedback clock FBCLK.

More specifically, the delay unit 221 includes a replica delay unit 221A and a second variable delay line 221B. The replica delay unit 221A is configured to output a replica delay clock REPCLK by delaying the internal clock INTCLK by the second delay amount (D3) equal (or substantially equal) to an actual delay through a clock path. The second variable delay line 221B is configured to output the feedback clock FBCLK by delaying the replica delay clock REPCLK by a delay amount for performing a locking operation of the DLL in response to the delay control signal DELY_CTRL.

The delay control unit 223 includes a phase comparing unit 223A and a delay control signal generating unit 223B. The phase comparing unit 223A is configured to compare a phase of the internal clock INTCLK with a phase of the feedback clock FBCLK. The delay control signal generating unit 223B is configured to generate the delay control signal DELY_CTRL in response to a comparison result outputted from the phase comparing unit 223A.

Hereinafter, an operation of the DLL 200 will be described in detail.

For purposes of illustration, a default/initial value of the first delay amount of the first and second variable delay lines 221B and 230 is assumed to be set to "0" according to the delay control signal DELY_CTRL outputted from the delay control signal generating unit 223B.

At an initial operation, the input buffer unit 210 buffers the external clock EXTCLK to output the internal clock INTCLK to the replica delay unit 221A. The replica delay unit 221A delays the internal clock INTCLK by the second delay amount (D3) to output the replica delay clock REPCLK. Here, the second delay amount (D3) is a replica delay amount equal to (e.g., substantially equal to) an actual delay through the clock path, and is set to a sum of the delay amount (D1) through the input path and the delay amount (D2) through the output path of the DLL 200.

Subsequently, since the first delay amount of the second variable delay line 221B is set to "0", the second variable delay line 221B passes the replica delay clock REPCLK without a further delay through the second variable delay line 221B and outputs the replica delay clock REPCLK as the feedback clock FBCLK. Subsequently, the phase comparing unit 223A compares the phase of the internal clock INTCLK with the phase of the feedback clock FBCLK, and the delay control signal generating unit 223B outputs the delay control signal DELY_CTRL to the second variable delay line 221B in response to the comparison result of the phase comparing unit 223A.

Accordingly, the second variable delay line 221B delays the replica delay clock REPCLK by the first delay amount to output the feedback clock FBCLK in response to the delay control signal DELY_CTRL.

The above-described operations are repeated during the operation of the DLL 200, and the first delay amount of the second variable delay line 221B is locked at a value (N*tCK−D3) when the phase of the internal clock INTCLK is synchronized with the phase of is the feedback clock FBCLK.

Meanwhile, the first variable delay line 230 also delays the internal clock INTCLK by the first delay amount which is determined in response to the delay control signal DELY_CTRL outputted from the delay control signal generating unit 223B. As the second variable delay line 221B is locked at the first delay amount (N*tCK−D3), the first variable delay line 230 is also locked at the first delay amount (N*tCK−D3). Accordingly, the first variable delay line 230 delays the internal clock INTCLK by the first delay amount (N*tCK−D3) to output the delay locked clock DLLCLK.

Figure 4:
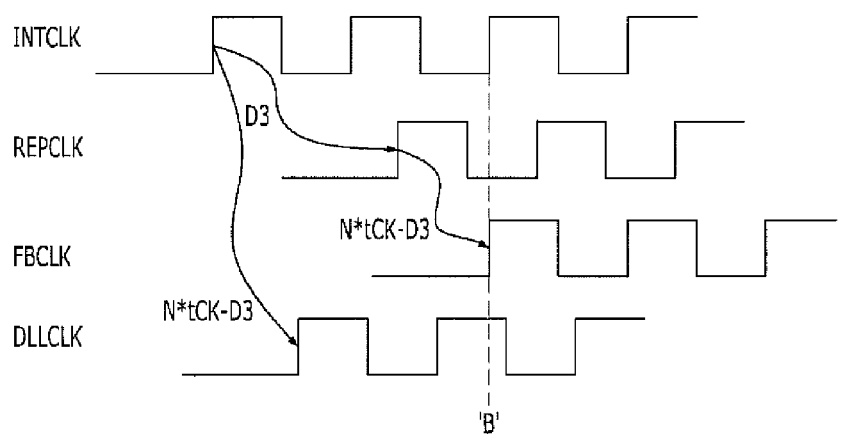
FIG. 4 is a waveform diagram illustrating a locking state of the DLL shown in FIG. 3.

FIG. 4 is a waveform diagram illustrating a locking state of the DLL 200 shown in FIG. 3.

Referring to FIG. 4, the phase of the internal clock INTCLK is synchronized with the phase of the feedback clock FBCLK at a point 'B'. At this time, the delay locked clock DLLCLK is lagging behind the internal clock INTCLK by the first delay amount (N*tCK−D3). Here, tCK is a unit cycle of the external clock EXTCLK.

Meanwhile, after a first delay amount (N*tCK−D3) of the first variable delay line 230 is determined, an operation for updating the first delay amount is performed at every update period. Since jitters may occur in the delay locked clock DLLCLK due to noise, the update operation is performed for compensating this jitter. While there is a delay for performing an update in the phase comparing unit 223A, the delay includes, for example, only the first delay amount (N*tCK−D3) of the second variable delay line 221B. Here, since a loop is formed by the second variable delay line 221B, the phase comparing unit 223A, and the delay control signal generating unit 223B, the delay for reflecting the update result in the phase comparing unit 223A does not include the second delay amount (D3) of the replica delay unit 221A. As a result, the update period may is shortened by not including an additional time equal to the second delay amount (D3) of the replica delay unit 221A.

As described above, in accordance with the embodiment of the present invention, a DLL can minimize/reduce a period of an update operation.

Figure 5:
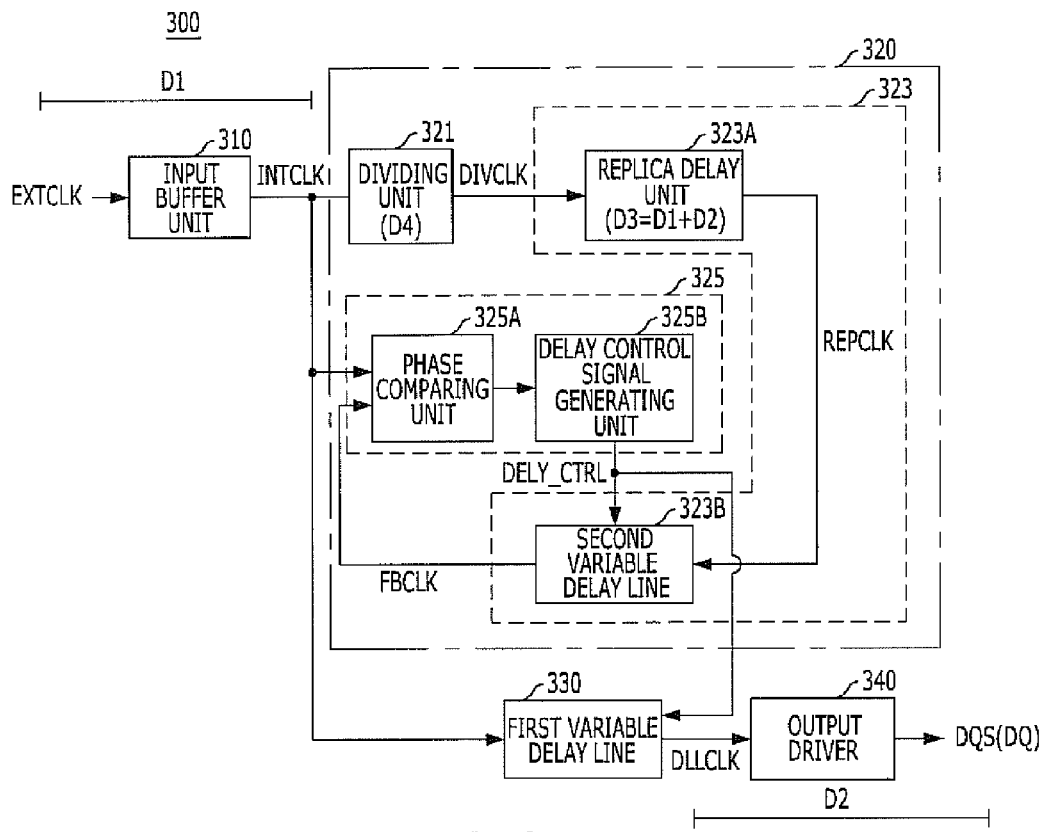
FIG. 5 is a block diagram of a DLL in accordance with another exemplary embodiment of the present invention.

FIG. 5 is a block diagram of a delay locked loop (DLL) 300 in accordance with another exemplary embodiment of the present invention.

For illustration purposes, this embodiment shown in FIG. 5 shows a configuration which may reduce current consumption as compared with the embodiment shown in FIG. 3. In FIG. 5, a further description of the elements substantially identical with those in FIG. 3 is omitted substantially as being redundant. However, differences in delay adjusting unit 320 are explained in detail.

Referring to FIG. 5, the DLL 300 includes an input buffer unit 310, a delay adjusting unit 320, a first variable delay line 330, and an output driver 340. The input buffer unit 310 is configured to buffer an external clock EXTCLK to output an internal clock INTCLK. The delay adjusting unit 320 is configured to delay the internal clock INTCLK to output a feedback clock FBCLK whose phase is substantially the same as the internal clock INTCLK and generate a delay control signal DELY_CTRL using the internal clock INTCLK and the feedback clock FBCLK. The first variable delay line 330 is configured to delay the internal clock INTCLK by a first delay amount to output a delay locked clock DLLCLK in response to the delay control signal DELY_CTRL. The output driver 340 is configured to output the delay locked clock DLLCLK to outside through a DQ pad (not shown).

More specifically, the delay adjusting unit 320 includes a dividing unit 321, a delay unit 323 and a delay control unit 325. The dividing unit 321 is configured to divide the internal clock INTCLK by a set dividing ratio to output a divided clock DIVCLK. The delay unit 323 is configured to output the feedback clock FBCLK by delaying the divided clock DIVCLK in response to the delay control signal DELY_CTRL. The delay control unit 325 is configured to generate the delay control signal DELY_CTRL based on the internal clock INTCLK and the feedback clock FBCLK.

Here, a delay through second variable delay line 323B is defined as a sum of the first delay amount for performing a locking operation of the DLL and a second delay amount (D3) which is a replica delay amount. More specifically, the second delay amount (D3) is a value (D1+D2−D4) generated by subtracting a fourth delay amount (D4) of the dividing unit 321 from a third delay amount (D1+D2) equal to (e.g., substantially equal to) an actual delay through a clock path. For illustration purposes, the third delay is equal to a sum of a delay amount (D1) through an input path and a delay amount (D2) through an output path of the DLL 300. The input path is a path from a pad (not shown) where the external clock EXTCLK is inputted to a point where the internal clock INTCLK is generated. The output path is a path from a point where the delay locked clock DLLCKL is generated to the DQ pad.

More specifically, the delay unit 323 includes a replica delay unit 323A and a second variable delay line 323B. The replica delay unit 323A is configured to output a replica delay clock REPCLK by delaying the divided clock DIVCLK by the second delay amount (D3) equal to (e.g., substantially equal to) an actual delay through a clock path. The second variable delay line 323B is configured to output the feedback clock FBCLK by delaying the replica delay clock REPCLK by a delay for performing a locking operation of the DLL.

The delay control unit 325 includes a phase comparing unit 325A and a delay control signal generating unit 325B. The phase comparing unit 325A is configured to compare a phase of the internal clock INTCLK with a phase of the feedback clock FBCLK. The delay control signal generating unit 325B is configured to generate the delay control signal DELY_CTRL in response to a comparison result outputted from the phase comparing unit 325A.

Hereinafter, an operation of the DLL 300 will be described in detail.

For purposes of illustration, a default/initial value of the first delay amount of the first and second variable delay lines 323B and 330 is assumed to be "0" according to the delay control signal DELY_CTRL outputted from the delay control signal generating unit 325B and the dividing ratio of the dividing unit 321 is assumed to be "2".

During an initial operation, the input buffer unit 310 buffers the external clock EXTCLK to output the internal clock INTCLK to the dividing unit 321. The dividing unit 321 divides (for example, by increasing periods) the internal clock INTCLK by 2 to output the divided clock DIVCLK.

The replica delay unit 323A delays the divided clock DIVCLK by the second delay amount (D3) to output the replica delay clock REPCLK. Here, the second delay amount (D3) is set to a value (D1+D2−D4) generated by subtracting the fourth delay amount (D4) of the dividing unit 321 from the third delay amount (D1+D2) equal to (e.g., substantially equal to) an actual delay through a clock path.

Subsequently, since a first delay amount of the second variable delay line 323B is set to "0" initially, the second variable delay line 323B passes the replica delay clock REPCLK without adding a delay and outputs the replica delay clock REPCLK as the feedback clock FBCLK. Subsequently, the phase comparing unit 325A compares the phase of the internal clock INTCLK with the phase of the feedback clock FBCLK, and the delay control signal generating unit 325B outputs the delay control signal DELY_CTRL to the second variable delay line 323B in response to the comparison result of the phase comparing unit 325A.

Accordingly, the second variable delay line 323B delays the replica delay clock REPCLK by the controlled first delay amount to output the feedback clock FBCLK in response to the delay control signal DELY_CTRL.

The above-described operations are repeated during the operation of DLL 300, and the first delay amount of the second variable delay line 323B is locked at a value (N*tCK−D3−D4) when the phase of the internal clock INTCLK is synchronized with the phase of the feedback clock FBCLK.

Meanwhile, the first variable delay line 330 also delays the internal clock INTCLK by the first delay amount which is determined in response to the delay control signal DELY_CTRL outputted from the delay control signal generating unit 325B. As the second variable delay line 323B is locked at the first delay amount (N*tCK−D3−D4), the first variable delay line 330 is also locked at the first delay amount (N*tCK−D3−D4). Accordingly, the first variable delay line 330 delays the internal clock INTCLK by the first delay amount (N*tCK−D3−D4) to output the delay locked clock DLLCLK.

Figure 6:
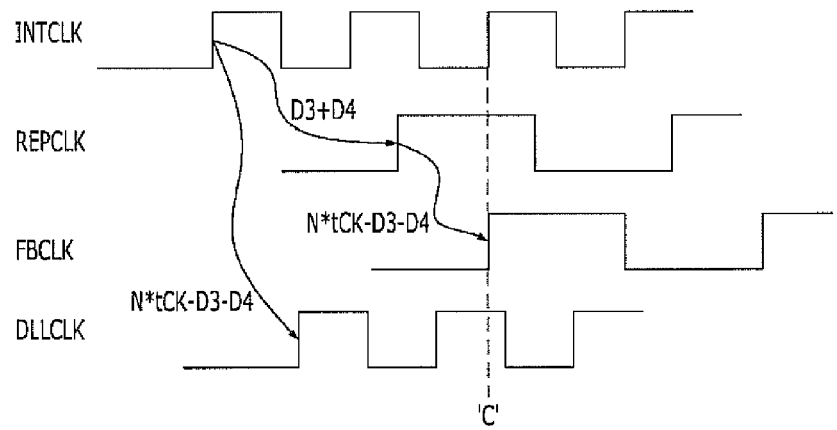
FIG. 6 is a waveform diagram illustrating a locking state of the DLL shown in FIG. 5.

FIG. 6 is a waveform diagram illustrating a locking state of the DLL 300 shown in FIG. 5.

Referring to FIG. 6, the phase of the internal clock INTCLK is synchronized with the phase of the feedback clock FBCLK at a point 'C'. At this time, the delay locked clock DLLCLK is lagging behind the internal clock INTCLK by the first delay amount (N*tCK−D3−D4). Here, tCK is a unit cycle of the external clock EXTCLK.

Here, after the first delay amount (N*tCK−D3−D4) of the first variable delay line 330 is determined, an operation for updating the first delay amount is performed at every update period. While a jitter may occur in the delay locked clock DLLCLK due to noise, the update operation compensates for this jitter. While a delay in updating the phase comparing unit 325A may occur, such a delay includes, for example, only the first delay amount (N*tCK−D3−D4) of the second variable delay line 323B. Here, since a loop is formed by the second variable delay line 323B, the phase comparing unit 325A, and the delay control signal generating unit 325B, the delay in updating the phase comparing unit 325A does not include the second delay amount (D3) of the replica delay unit 323A. As a result, the update period may is shortened by not including a delay equal to the second delay amount (D3) of the replica delay unit 323A.

Furthermore, the DLL shown in FIG. 5 reduces the number of transitions of a clock by using the divided clock DIVCLK during the update operation and during a process of tracking the first delay amount (N*tCK−D3−D4) of the first variable delay line 330. As a result, current consumption may be minimized/reduced.

As described above, in accordance with another embodiment of the present invention, a DLL may reduce current consumption while minimizing/reducing a period of an update operation.

While the present invention has been described with respect to the specific embodiments, it will be apparent to those skilled in the art that various changes and modifications may be made without departing from the spirit and scope of the invention as defined in the following claims.

What is claimed is:

1. A delay locked loop comprising:
a delay adjusting unit configured to delay a first clock signal in outputting a second clock signal phase-locked with the first clock signal and generate a delay control signal in response to the first clock signal and the second clock signal; and
a variable delay line configured to output a third clock signal by delaying the first clock signal in response to the delay control signal,
wherein the delay adjusting unit includes:
a replica delay unit configured to delay the first clock signal regardless of the delay control signal;
a second variable delay line configured to output the second clock signal by delaying an output of the replica delay unit in response to the delay control signal, wherein the replica delay unit provides the output thereof without receiving an input through the second variable delay line; and
a delay control unit configured to generate the delay control signal in response to the first clock signal and the second clock signal.

2. The delay locked loop of claim 1, wherein the delay adjusting unit further comprises:
a dividing unit configured to divide the first clock signal and output the divided clock signal to the delay unit.

3. The delay locked loop of claim 1, wherein the delay caused by the delay adjusting unit is equal to a sum of a delay for performing a locking operation of the delay locked loop and a delay through a clock path.

4. The delay locked loop of claim 1, further comprising:
an input buffer unit configured to buffer an external clock signal in outputting the first clock signal; and
an output driver configured to output the third clock signal.

5. The delay locked loop of claim 4, wherein the delay caused by the delay adjusting unit includes a delay through the input buffer unit and a delay through the output driver.

6. The delay locked loop of claim 1, wherein a loop is formed by the second variable delay line and the delay control unit except for the replica delay unit.

7. The delay locked loop of claim 1, wherein the variable delay line is configured to delay the first clock signal by a delay equal to a delay through the second variable delay line in response to the delay control signal.

8. A delay locked loop comprising:
a replica delay unit configured to output a first delayed clock by delaying a source clock by a first delay substantially equal to a delay through a clock path;
a delay control unit configured to generate a delay control signal in response to the source clock and the second delayed clock;

a first variable delay line configured to output a delay locked clock by delaying the source clock by a second delay for performing a locking operation of the delay locked loop in response to the delay control signal; and a second variable delay line configured to output the second delayed clock by delaying the first delayed clock by the second delay in response to the delay control signal, wherein the replica delay unit delays the source clock regardless of the delay control signal, and the replica delay unit provides its output without receiving an input through the second variable delay line.

9. The delay locked loop of claim 8, wherein the delay control unit comprises:

a phase comparing unit configured to compare a phase of the source clock with a phase of the second delayed clock; and a delay control signal generating unit configured to generate the delay control signal in response to a comparison result outputted from the phase comparing unit.

10. The delay locked loop of claim 8, further comprising:

an input buffer unit configured to buffer an external clock signal in outputting the source clock; and an output driver configured to output the delay locked clock.

11. The delay locked loop of claim 10, wherein the first delay is equal to a sum of a delay through the input buffer unit and a delay through the output driver.

12. A delay locked loop comprising:

a dividing unit configured to divide a source clock in outputting a divided clock;

a replica delay unit configured to output a first delayed clock by delaying the divided clock by a first delay;

a delay control unit configured to generate a delay control signal in response to the source clock and a second delayed clock;

a first variable delay line configured to output a delay locked clock by delaying the source clock by a second delay for performing a locking operation of the delay locked loop in response to the delay control signal; and a second variable delay line configured to output the second delayed clock by delaying the first delayed clock by the second delay in response to the delay control signal, wherein the replica delay unit delays the source clock regardless of the delay control signal, and the replica delay unit provides its output without receiving an input through the second variable delay line.

13. The delay locked loop of claim 12, wherein the delay control unit comprises:

a phase comparing unit configured to compare a phase of the source clock with a phase of the second delayed clock; and a delay control signal generating unit configured to generate the delay control signal in response to a comparison result outputted from the phase comparing unit.

14. The delay locked loop of claim 12, wherein the first delay is equal to a value generated by subtracting a delay of the dividing unit from a delay through a clock path.

15. The delay locked loop of claim 14, further comprising:

an input buffer unit configured to buffer an external clock signal to output the source clock; and an output driver configured to output the delay locked clock.

16. The delay locked loop of claim 15, wherein the delay equal to a delay through the clock path is equal to a sum of a delay through the input buffer unit and a delay through the output driver.

* * * * *